(12) United States Patent
Isa et al.

(10) Patent No.: US 7,538,431 B2
(45) Date of Patent: May 26, 2009

(54) SEMICONDUCTOR DEVICE

(75) Inventors: Satoshi Isa, Tokyo (JP); Mitsuaki Katagiri, Tokyo (JP); Fumiyuki Osanai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/126,681

(22) Filed: May 23, 2008

(65) Prior Publication Data

US 2008/0224311 A1 Sep. 18, 2008

Related U.S. Application Data

(63) Continuation of application No. 11/391,449, filed on Mar. 29, 2006, now Pat. No. 7,391,113.

(30) Foreign Application Priority Data

Mar. 30, 2005 (JP) ............................ 2005-096741

(51) Int. Cl.
*H01L 23/48* (2006.01)
(52) U.S. Cl. ...................... 257/737; 257/738
(58) Field of Classification Search ................. 257/737, 257/738
See application file for complete search history.

(56) References Cited

U.S. PATENT DOCUMENTS

2002/0190336 A1  12/2002  Shimizu et al.
2005/0184391 A1   8/2005  Shimizu et al.

FOREIGN PATENT DOCUMENTS

JP        2001-185576 A        7/2001

*Primary Examiner*—Douglas M Menz
(74) *Attorney, Agent, or Firm*—Sughrue Mion, PLLC (57) ABSTRACT

A semiconductor device is disclosed including a data family pad layout wherein an effort is made to contrive layouts of a power lead wire and a ground lead wire to minimize effective inductance in priority to a length of a lead wire between a pad and a solder ball land of a semiconductor chip. Pad layouts are arrayed in two rows and one unit of the pad layout is configured such that a data power source and ground are adjacent to each other or one data is inserted between the data power source and the ground. Such configurations decrease mutual inductance between the data power sources and increase mutual inductance between the data power source and the ground causing reduction in effective inductance between the data power source and the ground with the resultant minimization of power and ground noises.

13 Claims, 8 Drawing Sheets

SEMICONDUCTOR DEVICE

This application claims priority to prior Japanese patent application JP 2005-96741, the disclosure of which is incorporated herein by reference.

BACKGROUND OF THE INVENTION

1. Technical Field

The present invention relates to semiconductor devices and, more particularly, to a semiconductor device in which a semiconductor chip has a central area on which pads are disposed and connected to terminals of a package.

2. Related Art

In recent years, attempts have heretofore been made to achieve the speeding up and large-scale integration of a semiconductor device while promoting the miniaturization of a package for downsizing the device. For a large-capacity storage device, a dynamic access memory (hereinafter abbreviated to DRAM) has been developed with a storage capacity in a gigabit class and mounted on a package in a small size. For the miniaturization of the package, a technology has been implemented to provide a ball grid array (hereinafter abbreviated to BGA) of a surface mount type in which solder balls are placed on a package substrate. The placement and related electrical function of the solder balls of the BGA package are standardized and normalized. Such standardization is realized on a DRAM of a dual DOUBLE data rate 2 (DDR2) mode that is determined under JEDEC (Joint Electron Device Engineering Council) in which the placement of the solder balls for the substrate is specified.

Even with the DRAM having the same size in memory capacity, the DRAM includes various models with various numbers of bits for data to be simultaneously input and output. The DRAM is classified into a 4-bit component, an 8-bit component, a 16-bit component, 32-bit component and a 64-bit component etc., in terms of I/O width. Pin layouts of the components with such different number of bits are arranged to have a commonality to enable a user to achieve expansion or reduction of a storage capacity in a simplified fashion. That is, the commonality and standardization of the pin layouts in BGA of the components with various bits ensure an ease of expansion and reduction of such a storage capacity.

When semiconductor manufacturers conduct developments of the 4-, 8-, 16-, 32- and 64-bit components into commercialization, various techniques have been adopted as described below with a view to increasing development efficiency. These components have been developed as family products with a commonality. These components are handled as the same products on a chip production line and product change is made through bonding options. Or, product change is performed on a chip fabrication step through aluminum master slicing technique.

Further, a data pad layout of a semiconductor chip is arranged to have versatility with expansion capability. The other technique includes an effort to allow a layout of chip data pads to correspond to a standardized layout of BGA solder balls.

For the standardization of the layout for the solder balls (pins), not only the data pins (terminals) but also various pins (terminals) for a data power source and ground are specified and various pins (terminals) for data (DQ), a data power source (VDDQ) and data ground (VSSQ) are specified in one group. When handling data of multiple bits, the semiconductor chip includes, in addition to pins for the power source (VDD) and data ground (VSS) for a circuit in general, pins for the data power source (VDDQ) and data ground (VSSQ). This is because locating the pins for the data power source (VDDQ) and data ground (VSSQ) achieves the suppression of power and ground noises, caused by simultaneous operations in a data circuit, and enables high-speed data transmission.

The pin layouts (each with a ratio between the numbers of terminals) for data (DQ), the data power source (VDDQ) and data ground (VSSQ) are grouped in layouts of DQ:VDDQ:VSSQ=1:1:1 for a 4-bit component and DQ:VDDQ:VSSQ=2:1:1 for a component of more than 8 bits. A multiple-bit component with the number of bits greater than 8 bits includes a structure composed of repeatedly placed basic structures of the 8-bit components. To be ideal, the multiple-bit component with the number of bits greater than 8 bits may preferably have a ratio of DQ:VDDQ:VSSQ=1:1:1. However, due to restriction of the number of pads on the semiconductor chip, that ratio is specified as 2:1:1. Therefore, for the multiple-bit component, consideration needs to be taken on a pad layout of a data family that can suppress power and ground noises.

Figure 6:
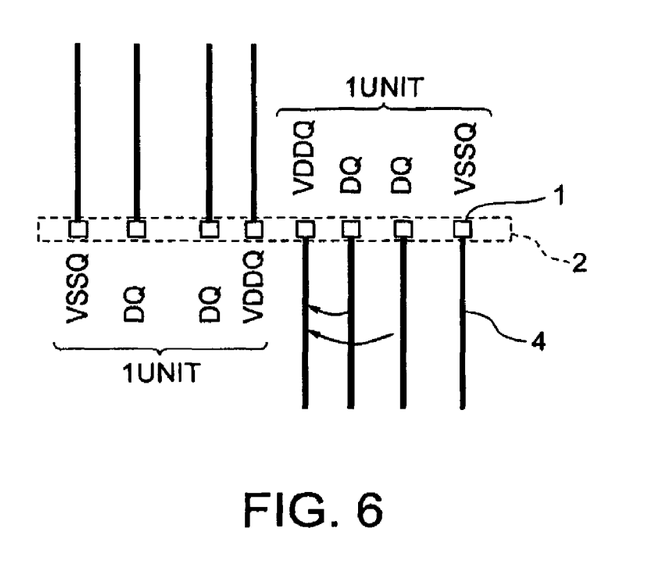
FIG. 6 is a pad layout view of a single row pad layout of the related art.

FIG. 6 is a pad layout view illustrating a pad layout 2 for a data family of such a semiconductor chip of the related art. Here, symbols "DQ", "VDDQ" and "VSSQ" designating data, the data power source and data ground will also be used for solder balls (pins) and lands of the package, and for pads and lead wires of the semiconductor chip unless no particular confusion is caused.

In FIG. 6, pads 1 are placed in a central area of the semiconductor chip along a single row. This layout represents an 8-bit component that includes one unit having respective pads for data ground (VSSQ), two data (DQ) and the data power source (VDDQ) in sequence and another unit having respective pads placed for the data power source (VDDQ), two data (DQ) and data ground (VSSQ) in sequence. The former unit is reversed in pad layout with respect to the latter unit. These units are repeatedly placed forming the 8-bit component. The 8-bit component has the pads for data, data power source/ground with the number of pads being specified in a ratio of DQ:VDDQ:VSSQ=2:1:1.

The pads placed in the chip center are alternately bonded via wires 4 to solder ball lands (not shown) located up and down each for one unit in upper and lower directions. Solder balls (not shown) are fixedly secured onto the lands. Since adjacent pads for data power sources (VDDQ) of the units are independently wire bonded in the upper and lower areas, no issue has occurred in inductance of the lead wires of the data power sources (VDDQ).

More particularly, abbreviating data ground (VSSQ) to "G", data (DQ) to "S" and data power source (VDDQ) to "V", the unit layouts can be expressed as G-S-S-V and V-S-S-G, respectively. In FIG. 6, the pads are placed in one row and the unit in layout of G-S-S-V is wire bonded to the solder ball lands on the upper side while the unit in layout of V-S-S-G is wire bonded to the solder ball lands on the lower side. Accordingly, even if the data power source pads are consecutively placed, the lead wires extend from the respective pads in the upper and lower areas in opposite directions and play a role as two power source pads.

Figure 7A:
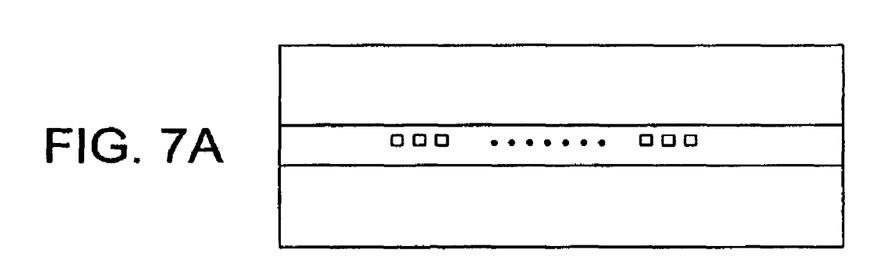

However, applying the pad layout of the related art to DRAM with further high-capacity results in new issues. With the chip in which the pads are placed in the chip center along the single row and memory cell arrays are located up and down, issues have occurred in that the chip size becomes too long in a lateral direction as shown in FIG. 7A and a shortage occurs in a photoresist exposure area on a production stage.

Figure 7B:
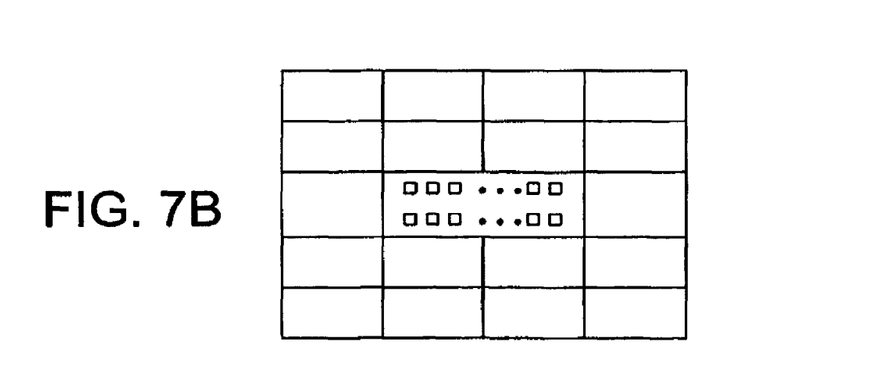

As shown in FIG. 7B, the present inventors have conducted studies on a scheme in that the memory cell arrays are located on both sides of the pad area and the two rows of pad layouts are placed in the pad area of the central portion. However, under situations where the related art pad layouts include data ground (VSSQ), two data (DQ) and the data power source (VDDQ) and are placed in the two rows, an undesirable consequence has turned out in that inductance causes disturbance in waveforms with the resultant inability of satisfying data transmission speed characteristic that is speeded up.

Figure 8:
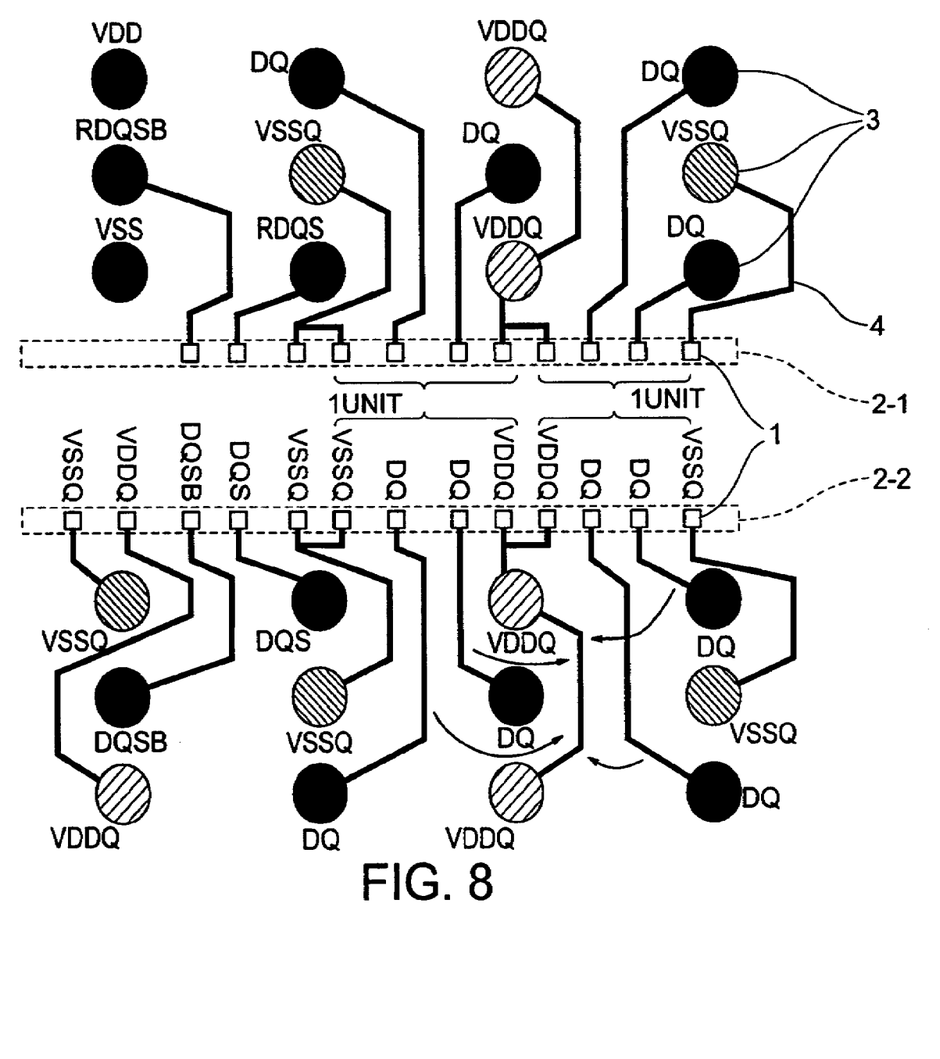
FIG. 8 is a pad layout view of an 8-bit component wherein a pad layout of the related art is applied to a two-row layout for comparison purpose to illustrate a significance of the present invention.

FIG. 8 is a layout view showing a pad layout and a standardized land (or ball) layout together with wirings. In the Figure, the same pad layout as that described with reference to FIG. 6 is applied to each layout of a chip with 8-bit structure having two rows of pad layouts. In FIG. 8, the pad layout is shown including a unit (unit of G-S-S-V) having pads for data ground (VSSQ), two data (DQ) and a data power source (VDDQ) placed in sequence and the other unit (unit of V-S-S-G) having pads for the data power source (VDDQ), two data (DQ) and data ground (VSSQ) placed in sequence with these neighboring units being placed up and down in two rows.

Therefore, with areas where adjacent pads are consecutively placed like V-V, G-G, lead wires extend from these pads in the same direction. Since two pads are juxtaposed to each other for the data power source (VDDQ) but are collected in a single line in the vicinity of the pads, the number of data (DQ) sharing the single lead wire for the data power source (VDDQ) includes four pieces equal to a value two times that of the related art. In FIG. 8, arrows designate that the four pieces of data lead wires share a single data power source lead wire. Thus, the data power source lead wiring has an adverse effect and has inductance which is equivalently doubled compared with that of the related art structure shown in FIG. 6. Such a condition similarly applies to a structure wherein the unit of V-S-S-G and the unit of G-S-S-V are placed adjacent to each other in this sequence. This is because such a structure has a consecutive area like a layout of G-G.

For a measure to address such issues, independent lead wires are conceivably placed for the respective pads of the data power sources and connected to solder ball lands for two data power sources. In such a case, due to electric current flowing through the independent lead wires in the same direction, a sum (effective inductance) of mutual inductance and self-inductances of the independent lead wires increase. (Also, if electric current flows in opposite directions, mutual inductance acts in reversed subtraction in contrast to the situation mentioned above.) Such an increase in inductance of the power source lead wire and ground lead wire causes an increase in power and ground noises, degradation in quality of an output signal on data (DQ) and degradations in a voltage margin of a device and a timing margin while causing negative impact on high frequency characteristic of the device during simultaneous switching when data is outputted.

Figure 9:
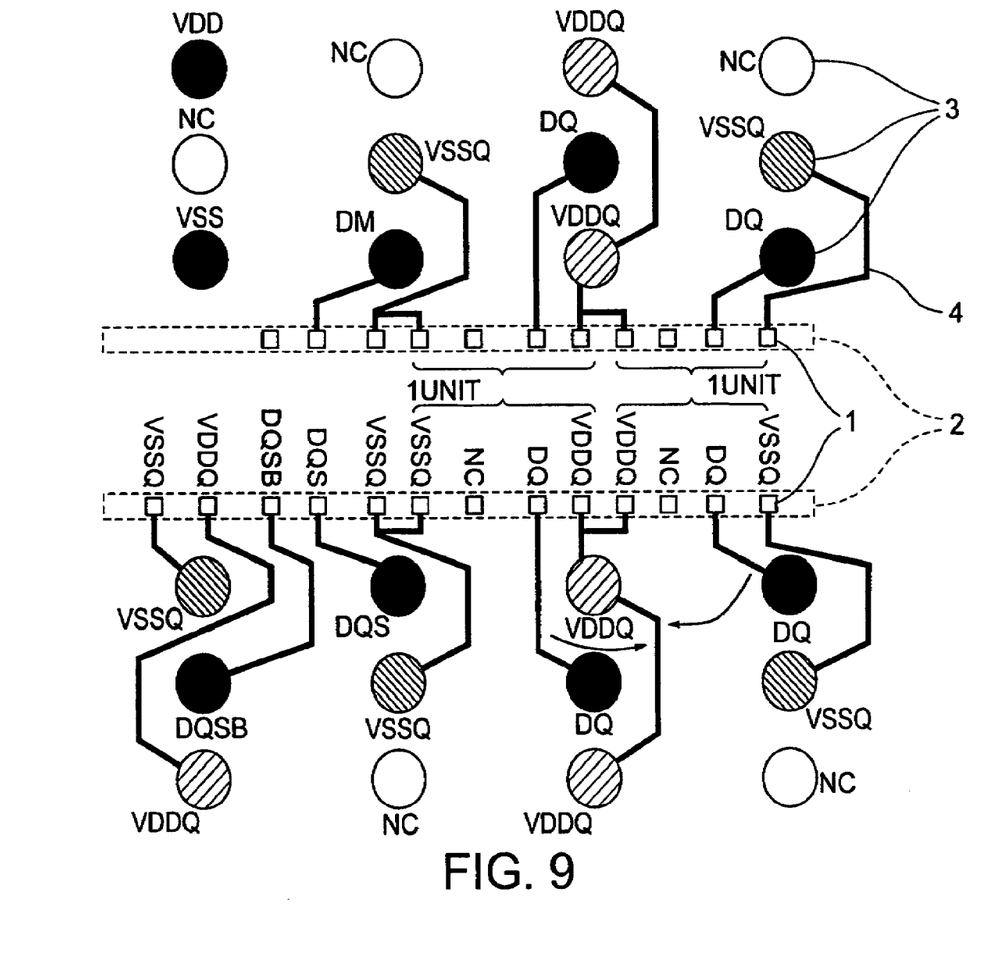
FIG. 9 is a pad layout view of a 4-bit component in which pad layouts of the related art are arrayed in two-row layouts.

With a 4-bit component shown in FIG. 9, the same semiconductor chips as those of the 8-bit component are employed in general practice. Data power source pads and ground pads are wire bonded and parts of data pads are not wire bonded with only pads corresponding to 4 bits being wire bonded. This allows an 8-pad structure in layouts of G-S-S-V, V-S-S-G of an 8-bit structure to be formed in a 6-pad structure in layouts of G-S-V, V-S-G. While the related art structure took the ratio of DQ:VDDQ:VSSQ=1:1:1, the number of data (DQ) sharing a single lead wire for the data power source (VDDQ) results in two pieces that are equal to a value two times that of the related art structure. Even with the 4-bit component, the same issues as those of the 8-bit component arise with the resultant occurrence of a factor causing deterioration in high frequency characteristic of the semiconductor device.

In such a way, it has turned out by the present inventors that both the 4-bit and 8-bit components have further deteriorated characteristics than those of currently available products and are not suited for high-speed data transmission. Thus, new task has been arising to provide a pad layout of a data family that complies with a solder ball layout specified under standardization while providing versatility for application to a multiple-bit component and suitability for the future of further high-speed data transmission.

A pad layout for a chip mounted on a BGA package is disclosed in Japanese Unexamined Patent Application Publication No. 2001-185576. This publication discloses the BGA package in which chip pads disposed in a central area of the chip are wire bonded to substrate pads located on both sides of the BGA substrate. A technology is disclosed wherein the substrate pads located on one side of the BGA substrate are disposed in the order of pads for a power source potential, a signal line and a ground potential to allow reduction in mutual inductance in wirings.

However, with the structure disclosed in the above patent publication, the chip pads are placed in a central area of the chip along a single row in layout of a power source, ground and a signal line with a ratio of 1:1:1. Accordingly, this patent publication has no problem recognition related to a two-row pad layout that is a task of the present invention to be addressed and provides no solution to the task of the present invention with the issues mentioned above remaining unaddressed.

As set forth above, with the semiconductor device formed in a large-scale integration and increased storage capacity, pad layouts need to be placed in two rows along a central area of the semiconductor chip. An urgent issue arises to find a solution to a pad layout of a data family that includes two rows of pad layouts in association with a layout of the solder ball lands (pins) determined as a standard and has versatility coped with a multiple-bit component to enable high-speed transmission.

SUMMARY OF THE INVENTION

The present invention has been completed with the above issues in mind and has an object to provide a pad layout of a data family that has reduced inductance in wiring between pads of a chip and lands (pins) of a BGA package and a semiconductor device incorporating the pad layout to enable high-speed data transmission.

According to a first aspect of the present invention, a semiconductor device has a semiconductor chip bonded to a BGA package substrate. The semiconductor chip has a central area on which first and second pad layouts are placed. The first and second pad layouts include units each having a data power source pad (V), a data ground pad (G) and data pads (S) between which the data power source pad (V) and the data ground pad (G) are sandwiched. Given pads included in the first and second pad layouts are wire bonded to solder ball lands of the BGA package substrate.

The units comprise a first unit including the data pad (S), the data power source pad (V), the data ground pad (G) and the data pad (S) placed in sequence or a second unit including the data pad (S), the data ground pad (G), the data power source pad (V) and the data pad (S) placed in sequence.

The first and second pad layouts may comprise two units selected from the first and second units and have an 8 bit data output structure.

Further, the first pad layout may comprise the first and second units and the second pad layout may comprise two pieces of the second units.

Furthermore, the first and second pad layouts may comprise the number of 2n-piece (with "n" representing a natural number greater than "2") of units selected from the first and second units and have an 8n bit data output structure.

Moreover, the first and second pad layouts may comprise two units selected from the first and second units, respectively, and the unit may be structured such that parts of the data pad (S) and the solder ball lands remain under a non-connected status to form a 4 bit data output structure.

Further, according to a second aspect of the present invention, a semiconductor device has a semiconductor chip connected to a BGA package substrate. The semiconductor chip has a central area on which first and second pad layouts are placed. The first and second pad layouts comprise a plurality of units selected from a first unit having a data ground pad (G), a data pad (S), a data power source pad (V) and a data pad (S) placed in sequence, a second unit in which the first unit and the pads are located in a reversed sequence, a third unit having a data power source pad (V), a data pad (S), a data ground pad (G) and a data pad (S) placed in sequence, and a fourth unit in which the third unit and the pads are located in a reversed sequence. Given pads included in the first and second pad layouts are wire bonded to solder ball lands of the BGA package substrate.

The first and second pad layouts may comprise the plurality of units, which include two pieces, respectively, and have an 8-bit data output structure.

In this case, the plurality of units may comprise first and second units.

Further, the first and second pad layouts may comprise the first and second units by 2n-pieces (with "n" representing a natural number greater than "2"), respectively, and have an 8-bit data output structure.

Furthermore, the first and second pad layouts may comprise the plurality of units, which include two pieces, respectively, and the selected respective units may have parts of the data pads and the solder ball lands remaining under a non-connected status to have a 4-bit data output structure.

With the semiconductor device according to the present invention, the two rows of pad layouts are placed in the central area of the semiconductor chip and the pads are connected to the solder ball lands formed on the package substrate. The data pads of the semiconductor chip are placed in correspondence to layouts of respective solder ball lands for the data power source and the ground in checker patterns. This pad layout is located to decrease mutual inductance between the lead wires for the data power source and increase mutual inductance between lead wires for the data power source and the ground power source while minimizing effective inductance between lead wires for the data power source and the ground. This makes it possible to obtain a semiconductor device that has low noises in the data power source and the ground with capability of high-speed data transmission.

BRIEF DESCRIPTION OF THE DRAWINGS

FIGS. 7A and 7B are chip structural views and FIG. 7A is a pad layout view illustrating a single row pad layout while FIG. 7B is a pad layout view illustrating a two-row row pad layout.

DESCRIPTION OF THE PREFERRED EMBODIMENTS

The present invention is described below in detail with reference to the accompanying drawings.

Figure 1:
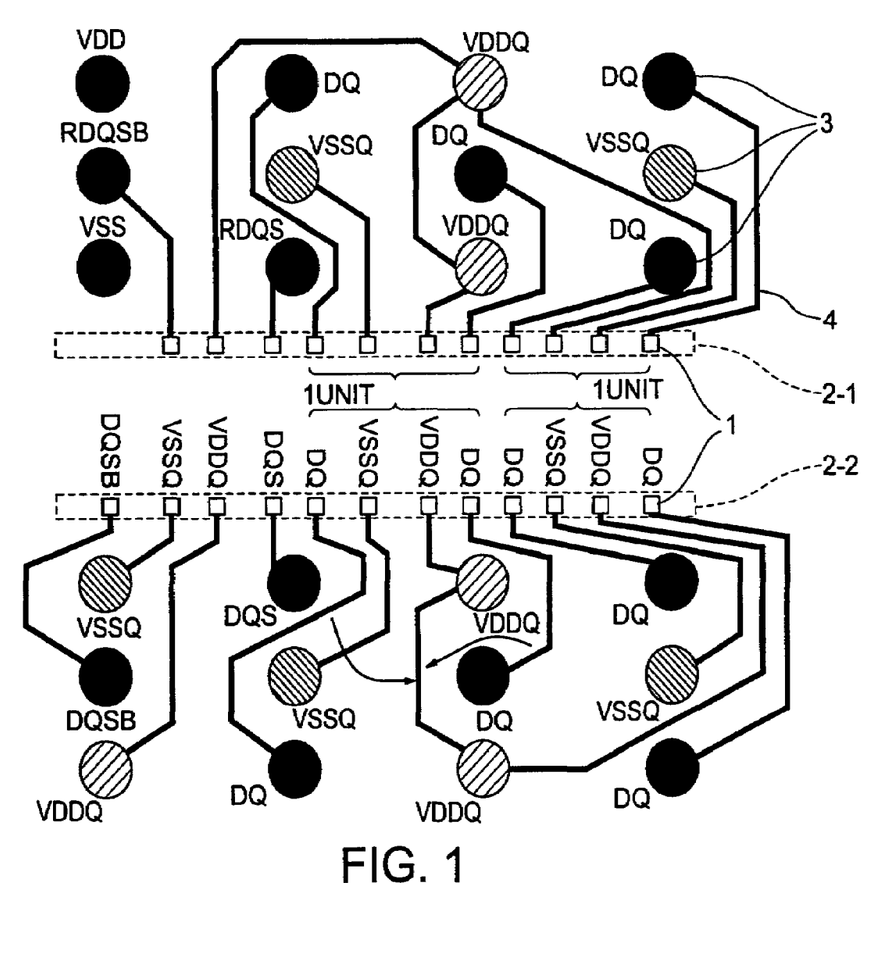
FIG. 1 is a pad layout view of an 8-bit component of a first embodiment according to the present invention.

FIG. 1 is a pad layout of an 8-bit component of a first embodiment according to the present invention. FIG. 1 typically shows pads 1 of a semiconductor chip, solder ball lands 3 of a BGA substrate, and lead wires 4 by which the pads 1 and the solder ball lands 3 are connected to each other. Here, symbols "DQ", "VDDQ" and "VSSQ" designating data, the data power source and data ground will also be used for solder balls (pins) and lands of the package, and for pads and lead wires of the semiconductor chip unless no particular confusion is caused.

In FIG. 1, the semiconductor chip has a central area on which pad layouts each including a plurality of pads 1 are disposed in upper and lower areas in two rows. The pads of the upper pad layout 2-1 are wire bonded to the solder ball lands 3 formed in the upper area, respectively, and the pads of the lower pad layout 2-2 are wire bonded to the solder ball lands 3 formed in the lower area, respectively.

FIG. 1 also typically shows a layout of the solder ball lands 3 standardized as an 8-bit component in connection with respective lands of a power source, ground, data strobes and data. As used herein, the term "data strobes" refers to data strobe signals that contain one pair of strobe signals DQS, DQSB (B representing inversion), which are allocated to data of 4 bits, and another pair of strobe signals RDQS, RDQSB (B representing inversion), which are allocated to data of the remaining 4 bits. Although data includes 8 bits (DQ0~DQ7), data is collectively and merely designated as data (DQ).

The pad layouts 2 of the chip take a two-row structure including the respective pads for a data strobe family (DQS, DQSB, RDQS, RDQSB), data (DQ), a data power source (VDDQ) and ground (VSSQ). The other pads and lead wires for a power source (VDD) of circuits in general and ground (VSS) or the like are herein omitted. The pads of the chip include the data family having data (DQ), data ground (VSSQ), the data power source (VDDQ) and data (DQ) placed in sequence as one unit. Abbreviating data (DQ) to "S", data ground (VSSQ) to "G" and the data power source (VDDQ) to "V" results in a layout of S-G-V-S in sequence. With another unit placed next to this unit, a layout appears as S-V-G-S placed in sequence.

The upper pad layout 2-1 includes the pads placed for the units of S-G-V-S and S-V-G-S and the lower pad layout 2-2 includes the pads placed for the units of S-V-G-S and S-G-V-S to form 8-bit data. With the second unit (S-V-G-S) on the upper side, "V" and "G" are altered in contrast to the first unit (S-G-V-S) and it is important for the pads of the data power source (VDDQ) and data ground (VSSQ) to be located adjacent to each other. Their sequence may be either S-G-V-S or S-V-G-S as long as wiring allows.

The solder ball lands 3 for the 8-bit component are arrayed up and down by three pieces. As the solder ball lands 3 for a first row in the upper area a left side thereof, lands are placed for a general-purpose power source (VDD), data strobe ground (RDQSB) and general-purpose ground (VSS). As the solder ball lands 3 for a second row in the upper area, lands are placed for data (DQ), data ground (VSSQ) and the data strobe (RDQS). For a subsequent third row, lands are placed for the data power source (VDDQ), data (DQ) and the data power source (VDDQ). Additionally, for a fourth row, lands are placed for data (DQ), data ground (VSSQ) and data (DQ). The number of lands is arranged in a ratio of DQ:VDDQ: VSSQ=2:1:1.

Likewise, as the solder ball lands 3 for the second row in the lower area, lands are placed for the data strobe (DQS), data ground (VSSQ) and data (DQ). For a subsequent third row, lands are placed for the data power source (VDDQ), data (DQ) and the data power source (VDDQ) and, additionally, for a fourth row, lands are placed for data (DQ), data ground (VSSQ) and data (DQ). The number of the lands is arrayed in the same ratio of DQ:VDDQ:VSSQ=2:1:1 like those of the upper area. The solder ball lands 3 in the upper and lower areas take a fixed ratio of the power source and data and placed in symmetry with respect to a line passing through a middle between the two rows of pad layouts of the semiconductor chip.

Here, the third row has two data power sources (VDDQ) in the upper and lower areas, respectively, and one data ground (VSSQ) is located in the second and fourth rows at centers thereof, respectively. The lands for the power sources and ground are placed in checker patterns for respective rows with a ratio of 1:2:1. It raises concern on a wiring method of extending lead wires from the lands of two data power sources (VDDQ) placed in the same row. Considering the two lands of data power sources (VDDQ) placed in the same row and the pad layout of the related art, the two lead wires tend to be connected to the pads for two data power sources (VDDQ) in parallel to each other to shorten a wiring length as previously mentioned with reference to FIG. 9. Such a configuration leads to increase effective inductance and induces increased power noise with the resultant inability of achieving high-speed data transmission.

According to the present invention, effective inductance of lead wires for power sources is reduced in priority to an effort to conduct the related art practice in which a wiring distance is shortened to a minimal length. That is, the present inventor has took a reversed way of thinking in which priority attempt is taken to stop parallel placement of pads of data power sources (VDDQ) and place the relevant pads in remote positions for reduction of mutual inductance between the associated power source lead wires whereas the data power source (VDDQ) and data ground (VSSQ) are placed in areas close to each other for an increase in mutual inductance upon which electric currents are caused to flow through the lead wires in opposite directions to minimize effective inductance. With the inventor's problem recognition and creative ingenuity for reduction of inductance in priority to a length of the lead wire for the power source, an optimum pad layout and layout of wire leads for the solder ball lands 3 are obtained for the semiconductor chip.

As shown in FIG. 1, the pad layout of the semiconductor chip includes one unit that has data (DQ), the data ground (VSSQ), the data power source (VDDQ) and data (DQ) in sequence or data (DQ), the data power source (VDDQ), the data ground (VSSQ) and data (DQ) in sequence. That is, the pads are located in layouts of S-G-V-S and S-V-G-S. Upon comparing such layouts to the layouts of the lead wires for the 8-bit component of the related art practice shown in FIG. 8, it will be understood that with the present embodiment, the lead wires of the power source and ground increase in length. No parallel placement of the pads for the data power sources (VDDQ) is made and the lead wires of the data power sources (VDDQ) are placed in remote areas for reduction of mutual inductance. Additionally, the pads for the data power source (VDDQ) and data ground (VSSQ) through which electric currents flow in opposite directions are placed adjacent to each other for an increase in mutual inductance with the resultant reduction in effective inductance. It has been confirmed that such a configuration results in reduction of power and ground noises and is suited for high-speed data transmission. At this time, two data lines are allocated to one data power source (VDDQ) to be held in the ratio of DQ:VDDQ: VSSQ=2:1:1.

Figure 2:
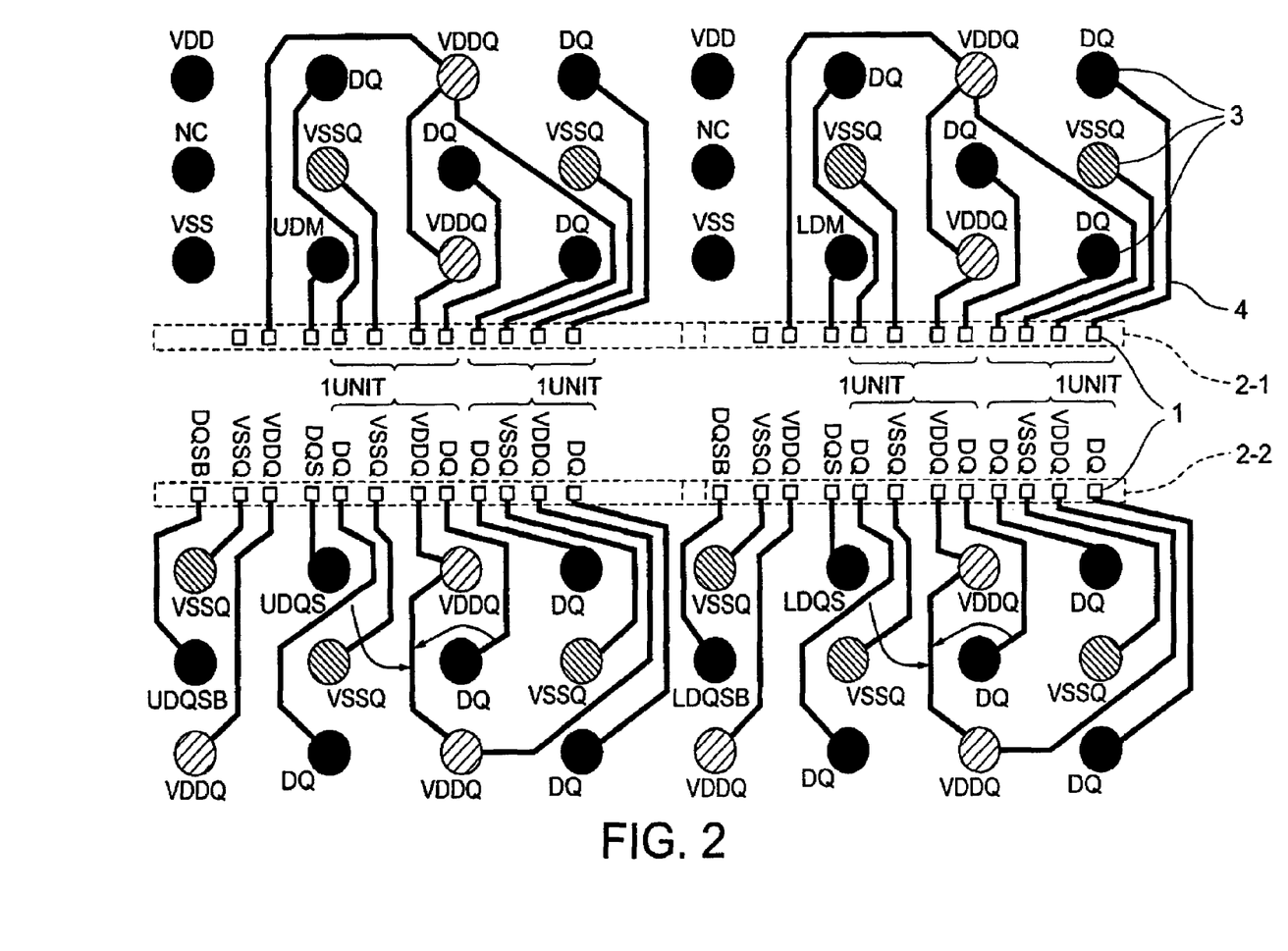
FIG. 2 is a pad layout view of a 16-bit component of a second embodiment according to the present invention.

FIG. 2 shows a layout of a 16-bit component of a second embodiment according to the present invention employing an expanded form of the 8-bit component shown in FIG. 1. In FIG. 2, the same component parts as those of the first embodiment bear like reference numerals or reference symbols and description of the same is herein omitted.

In FIG. 2, the 16-bit component takes the form of a layout in which the pad layouts of the 8-bit components are repeatedly placed. However, with respect to data strobe signals, an 8-bit signal of a higher order and an 8-bit signal of a lower order bear additional identification codes "U" and "L", respectively, in order to discriminate the 8-bit signal of the higher order and the 8-bit signal of the lower order from each other. Thus, the 16-bit component can be obtained in a simple fashion by repeatedly placing the 8-bit components. It can be simply understood that in FIG. 2, the 16-bit component takes the form of the same structure as that of FIG. 1 with the resultant same advantageous effects as those of the structure shown in FIG. 1 and, hence, detailed description of the same is herein omitted. Here, while the present embodiment takes the form of the 16-bit component upon repeatedly placing the two pad layouts of the 8-bit components, an 8n-bit component may be structured upon repeatedly placing an n-number of pieces (with "n" representing a natural number greater than "2").

Figure 3:
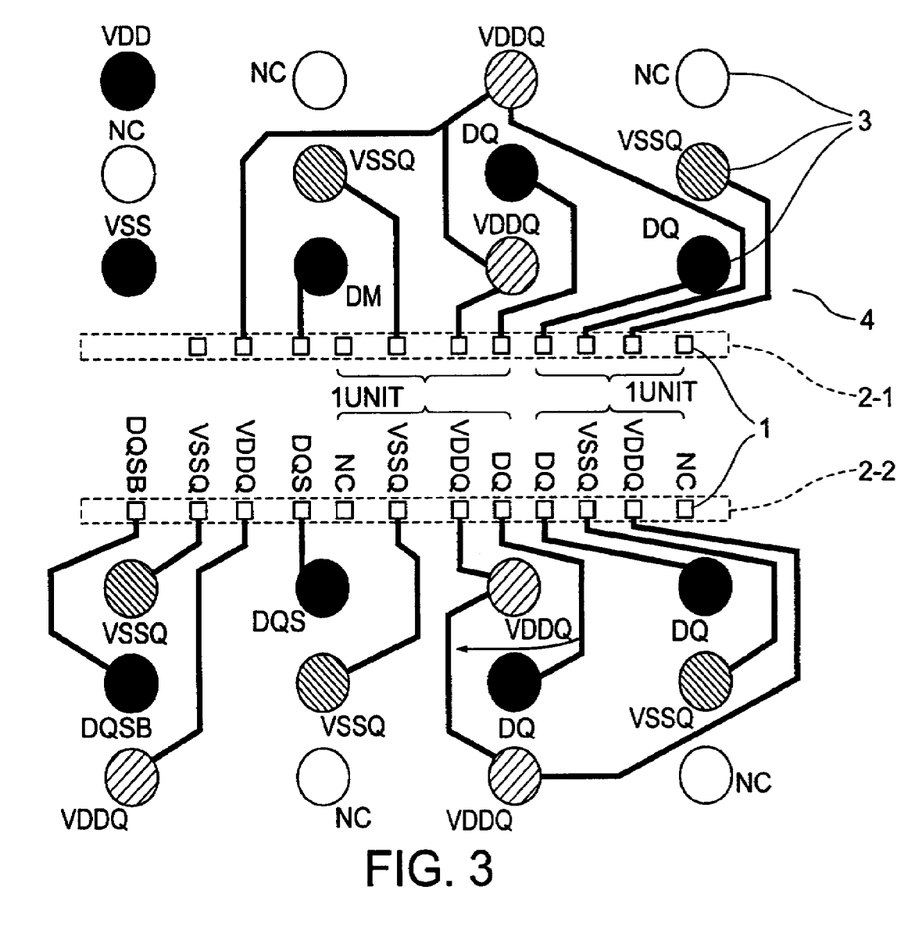
FIG. 3 is a pad layout view of a 4-bit component of a third embodiment according to the present invention.

FIG. 3 shows a layout of a 4-bit component of a third embodiment according to the present invention. In FIG. 3, the 4-bit component can be structured upon removing unnecessary data bits from the structure of FIG. 1. With such a layout, the pads for the solder ball lands 3 corresponding to four pieces of data of a semiconductor chip remain under "NC (Non Connection)" and the land of the data strobe signal RDQS is converted to a data mask DM (Data Mask) signal. Among the 8 pads placed in the pad layout of S-G-V-S and the consecutive pad layout of S-V-G-S of the 8-bit component, the pads S on both ends are held under "NC" to provide six pads in layouts G-V-S and S-V-G. With such a structure, the pads for data power source (VDDQ) and data ground (VSSQ) are wire bonded in the same pattern as that of the 8-bit component.

In general practice, the 4-bit component employs the same semiconductor chip as that of the 8-bit component and product change is made upon selecting, for instance, bonding options. With the number of bits of output data being reduced, one piece of data line is allocated to one piece of data power source (VDDQ) in layout of DQ:VDDQ:VSSQ=1:1:1. Accordingly, power and ground noises are further minimized and a semiconductor device suited for high-speed data transmission can be obtained.

With the semiconductor devices of the first to third embodiments, the central area of the semiconductor chip includes the two rows of pad layouts and the pads are wire bonded to the solder ball lands formed on the package substrate. The data power source and ground are correlated to the solder ball lands disposed in the checker pattern and the data family pad layouts of the semiconductor chip are arranged in layouts of S-V-G-S or S-G-V-S. With such structures, mutual inductance between data power sources decreases and mutual inductance between the data power source and ground increases. This results in reduction of effective inductance between the data power source and ground and noises in the data power source and ground are minimized whereby a semiconductor device available to achieve high-speed data transmission can be obtained.

Figure 4:
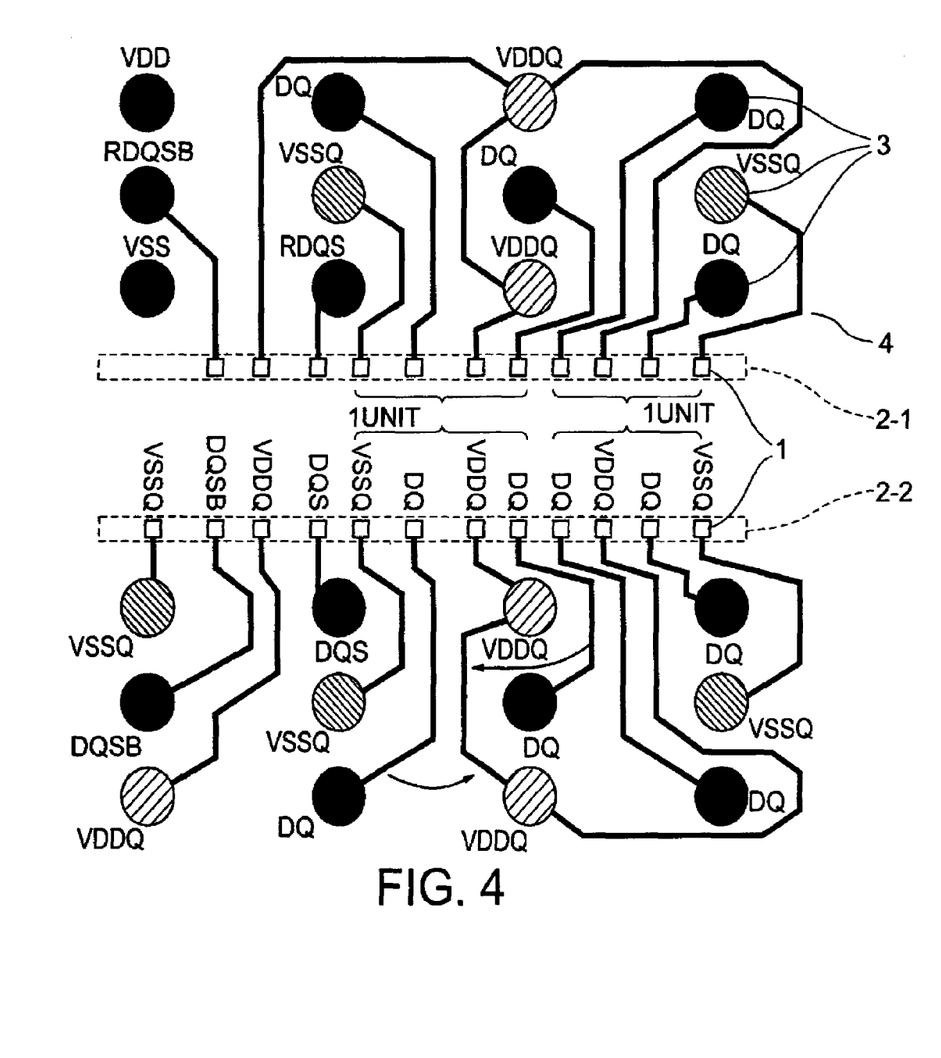
FIG. 4 is a pad layout view of an 8-bit component of a fourth embodiment according to the present invention.

FIG. 4 shows a pad layout of an 8-bit component of a fourth embodiment according to the present invention. FIG. 4 typically expresses pads 1 of a semiconductor chip, solder ball lands 3 of a BGA substrate and lead wires 4 through which the pads 1 and the solder ball lands 3 are wire bonded. Also, the same component parts, the same power source and the same signals as those of the first embodiment bear like reference numerals, like name of the power source and like name of the signal and description of the same is herein omitted.

With the pads shown in FIG. 4, the data ground (VSSQ), data (DQ), the data power source (VDDQ) and data (DQ) are formed in one unit and the 8-bit component includes a unit in layout of G-S-V-S and the other unit in layout of S-V-S-G. The data ground (VSSQ) and the data power source (VDDQ) are located between which data (DQ) is sandwiched. With such a structure, no parallel placement of the data power sources (VDDQ) are achieved with the resultant reduction in mutual inductance between the data power sources (VDDQ) and increase in mutual inductance between the data power source and ground. This results in reduction of effective inductance between the data power source (VDDQ) and ground (VSSQ) and noises of the data power source and ground can be minimized whereby a semiconductor device available to achieve high-speed data transmission can be obtained. Moreover, by repeatedly placing the pad layout of the 8-bit structure shown in FIG. 4 in the same manner as the second embodiment, a component of bits more than 16 bits can be obtained.

Also, while the structure, shown in FIG. 4, incorporates the unit in layout of G-S-V-S and the unit in layout of S-V-S-G, it becomes possible to use arbitrary units selected from various units in layouts of G-S-V-S, S-V-S-G, V-S-G-S and S-G-S-V. With the 8-bit component, the pad layouts 2-1, 2-2 employ two pieces of arbitrary units selected from these units. These two units may include the same units or different units. Moreover, in case of the 16-bit component, the respective pad layouts 2-1, 2-2 may include four units arbitrarily selected from the units described above.

Figure 5:
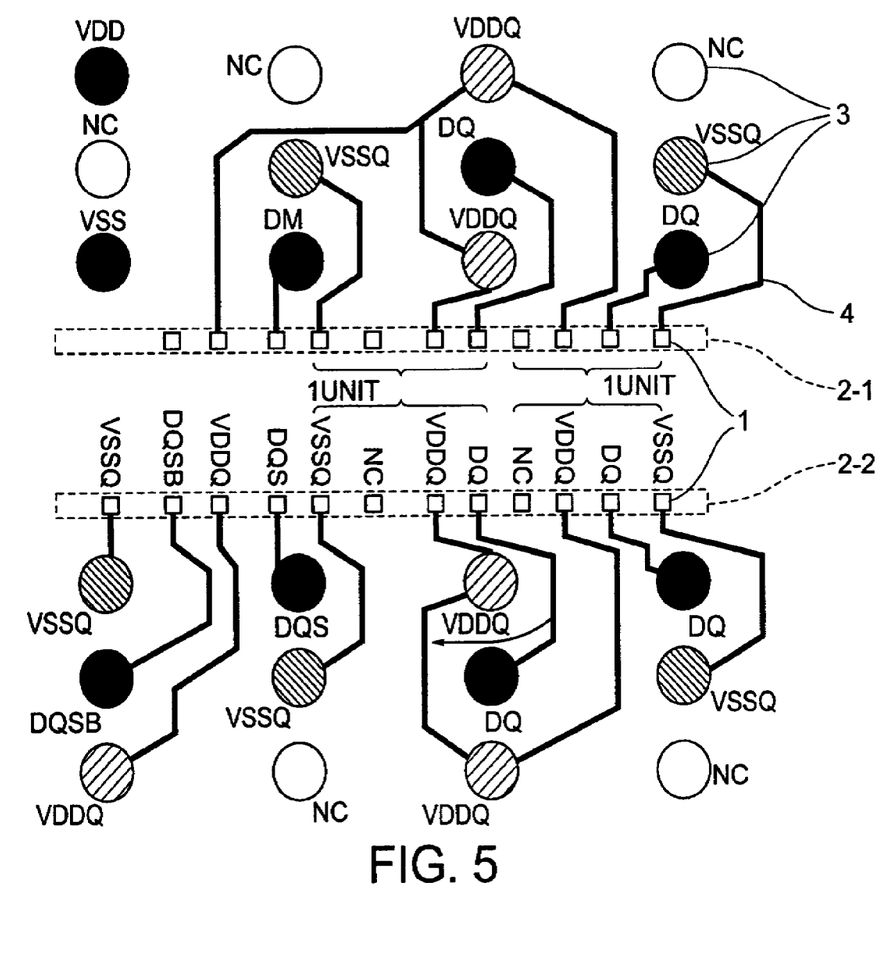
FIG. 5 is a pad layout view of a 4-bit component of a fifth embodiment according to the present invention.

FIG. 5 shows a layout of a 4-bit component of a fifth embodiment according to the present invention. With this embodiment, the 4-bit component can be structured upon removing unnecessary data bits from the structure shown in FIG. 4. With such a layout, the pads for the solder ball lands 3 corresponding to four pieces of data of a semiconductor chip remain under "NC (Non Connection)" and the land of the data strobe signal RDQS is converted to the data mask DM (Data Mask) signal. The pad layouts of G-S-V-S and S-V-S-G of the 8-bit structure are converted to six pads in layouts of G-V-S and V-S-G. The data power source (VDDQ) and the ground (VSSQ) are wire bonded. The number of bits of output data is reduced and one piece of data line is allocated to one piece of data power source (VDDQ) in layout of DQ:VDDQ: VSSQ=1:1:1. Accordingly, power and ground noises are further reduced and a semiconductor device suited for high-speed data transmission can be obtained.

The fourth and fifth embodiments also have the same advantageous effects as those of the first to third embodiments. Mutual inductance between the data power sources decreases and mutual inductance between the data power source and ground increases. This results in reduction of effective inductance between the data power source and ground. Thus, noises in the data power source and ground are eliminated and a semiconductor device available for high-speed data transmission can be obtained.

While the present invention has been described above in concrete form with reference to the embodiments, it is needless to say that the present invention is not limited to the embodiments mentioned above and can be implemented in various modifications without departing from the spirit and scope of the present invention.

What is claimed is:

1. A semiconductor memory device comprising:
a BGA package substrate formed with a plurality of lands which is arrayed on the substrate at the both sides of an elongated space;
a semiconductor chip bonded to the substrate, the semiconductor chip having a plurality of electrode pads disposed in two rows in a central area of the semiconductor chip so that the electrode pads are arranged at said elongated space; and
wires electrically connecting the electrode pads to the corresponding lands, respectively;
wherein said electrode pads includes units each having a data power source pad, a data ground pad, and data pads between which the data power source pad and the data ground pad are placed, respectively;
wherein a pad number ratio in said units is configured as 2:1:1 in terms of numbers of the data pads, the data power source pads, and the data ground pads.

2. The semiconductor memory device according to claim 1, wherein the units comprise a first unit having the data pad, the data power source pad, the data ground pad and the data pad which are placed in sequence or a second unit having the data pad, the data ground pad, the data power source pad and the data pad which are placed in sequence.

3. The semiconductor memory device according to claim 2, wherein each of the rows comprises two of the units selected from the first and second units so as to configure an 8 bit data output structure.

4. The semiconductor memory device according to claim 3, wherein the one of the rows comprises the first and second units and the other of the rows comprises two pieces of the second units.

5. The semiconductor memory device according to claim 2, wherein each of the rows comprises units of 2n-pieces (with "n" representing a natural number greater than "2") selected from the first and second units so as to configure an 8n-bit data output structure.

6. The semiconductor memory device according to claim 1, wherein each of the rows comprises one piece of the units and another piece of the units in which one of the data pads and the corresponding land are held under non-connection so as to configure a 4-bit data output structure.

7. A semiconductor memory device comprising:
a package substrate formed with a plurality of lands which is arrayed on the substrate at the both sides of an elongated space;
a semiconductor chip bonded to the substrate, the semiconductor chip having a plurality of electrode pads disposed in two rows in a central area of the semiconductor chip so that the electrode pads are arranged at said elongated space; and wires electrically connecting the electrode pads to the corresponding lands, respectively;

wherein said electrode pads includes a plurality of units selected from a first unit having a data ground pad, a data pad, a data power source pad and a data pad placed in sequence, a second unit in which the pads are placed in a sequence reverse to the one in the first unit, a third unit having a data power source pad, a data pad, a data ground pad and a data pad placed in sequence, and a fourth unit in which the pads are placed in a sequence reverse to the one in the third unit;

wherein a pad number ratio in said plurality of units is configured as 2:1:1 in terms of numbers of the data pads, the data power source pads, and the data ground pads.

8. The semiconductor memory device according to claim 7, wherein each of the rows comprise two pieces of the plurality of units, respectively, to configure an 8-bit data output structure.

9. The semiconductor memory device according to claim 8, wherein the plurality of units comprises only first and second units.

10. The semiconductor memory device according to claim 7, wherein each of the rows comprises 2n-pieces (with "n" representing a natural number greater than "2") of the plurality of units, respectively, to configure an 8-bit data output structure.

11. The semiconductor memory device according to claim 7, wherein each of the rows comprises one piece of the plurality of units, respectively, and another piece of the plurality of units in which one of the data pads and the corresponding land are held under non connection to configure a 4-bit data output structure.

12. A DRAM device comprising:

a package substrate formed with plural lands which are arrayed in rows and columns on the substrate at the both sides of an elongated space of the substrate, said plural lands including a power land assigned for a power source, a ground land assigned for a ground potential, a set of data lands assigned for data bits, a set of data power lands assigned for a data power source, and a set of data ground lands assigned for a data ground potential;

a DRAM chip bonded to the substrate, the DRAM chip having plural electrode pads disposed in two rows on a central area of the semiconductor chip so that the electrode pads are arranged at said elongated space, said plural electrode pads including a power pad assigned for the power source, a ground pad assigned for the ground potential, a set of data pads assigned for data bits, a set of data power pads assigned for the data power source, and a set of data ground pads assigned for the data ground potential; and wires electrically connecting the electrode pads to the corresponding lands, respectively, wherein the rows of said electrode pads include units each having one of the data power source pads, one of the data ground pads, and tow of the data pads between which the data power source pad and the data ground pad are placed so that four of the pads are aligned in sequence, respectively, wherein a number ratio in said units is configured as 2:1:1 in terms of numbers of the data pads, the data power source pads, and the data ground pads.

13. A DRAM device comprising:

a package substrate formed with plural lands which is arrayed in rows and columns on the substrate at the both sides of an elongated space of the substrate, said plural lands including a power land assigned for a power source, a ground land assigned for a ground potential, a set of data lands assigned for data bits, a set of data power lands assigned for a data power source, and a set of data ground lands assigned for a data ground potential;

a DRAM chip bonded to the substrate, the DRAM chip having plural electrode pads disposed in two rows on a central area of the semiconductor chip so that the electrode pads are arranged at said elongated space, said plural electrode pads including a power pad assigned for the power source, a ground pad assigned for the ground potential, a set of data pads assigned for data bits, a set of data power pads assigned for the data power source, and a set of data ground pads assigned for the data ground potential; and wires electrically connecting the electrode pads to the corresponding lands, respectively, wherein the rows of said electrode pads include plural units selected from a first unit having one of the data ground pads, one of the data pads, one of the data power source pads and one of the data pads placed in sequence, a second unit in which the pads are placed in a sequence reverse to the one in the first unit, a third unit having one of the data power source pads, one of the data pads, one of the data ground pads and one of the data pads placed in sequence, and a fourth unit in which the pads are placed in a sequence reverse to the one in the third unit;

wherein a number ratio in said plural units is configured as 2:1:1 in terms of numbers of the data pads, the data power source pads, and the data ground pads.

* * * * *